United States Patent
Shinagawa et al.

(10) Patent No.: US 8,222,639 B2
(45) Date of Patent: Jul. 17, 2012

(54) NITRIDE BASED SEMICONDUCTOR DEVICE AND METHOD OF MANUFACTURING THE SAME

(75) Inventors: Tatsuyuki Shinagawa, Tokyo (JP); Hirotatsu Ishii, Tokyo (JP); Akihiko Kasukawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/535,009

(22) Filed: Aug. 4, 2009

(65) Prior Publication Data

US 2010/0051939 A1    Mar. 4, 2010

(30) Foreign Application Priority Data

Aug. 4, 2008    (JP) .................... 2008-200544

(51) Int. Cl.
*H01L 29/10* (2006.01)

(52) U.S. Cl. ..... 257/43; 257/94; 257/103; 257/E21.001; 257/E33.001; 257/E29.068; 438/47

(58) Field of Classification Search ................ None
See application file for complete search history.

(56) References Cited

U.S. PATENT DOCUMENTS

| | | | | |
|---|---|---|---|---|
| 5,815,520 A | * | 9/1998 | Furushima | 372/45.01 |
| 5,828,684 A | * | 10/1998 | Van de Walle | 372/45.011 |
| 6,515,313 B1 | * | 2/2003 | Ibbetson et al. | 257/103 |
| 2008/0191203 A1 | * | 8/2008 | Fujioka et al. | 257/43 |

FOREIGN PATENT DOCUMENTS

JP    06-061527 A    3/1994

OTHER PUBLICATIONS

Hellman, Buchanan, Wiesmann, and Brener, Growth of Ga-face and N-face GaN films using ZnO Substrates, "MRS Internet Journal o f Nitride Semiconductor Research", 1996, vol. 1, Article 16.

Li, Wang, Nause, Valencia, Summers, and Ferguson, InGaN Layers Grown on Al2O3/ZnO Substrates Prepared by Atomic Layer Deposition, Mater. Res. Soc. Symp. Proc. vol. 1035, 2008, Materials Research Society.

* cited by examiner

*Primary Examiner* — Hrayr A Sayadian

(74) *Attorney, Agent, or Firm* — Lowe, Hauptman, Ham & Berner, LLP

(57) ABSTRACT

An interfacial reaction suppressing layer 12 formed between an oxide layer including a ZnO single crystal substrate 11 and a nitride layer including an InGaN semiconductor layer 13 restrains the interfacial reaction between the oxide layer and the nitride layer and formation of a reaction layer ($Al_2ZnO_4$) at the interface, which makes it possible to grow and thermally treat the InGaN semiconductor layer 13 at a high temperature. Thus, a crystal quality of the InGaN semiconductor layer 13 is improved.

1 Claim, 4 Drawing Sheets

NITRIDE BASED SEMICONDUCTOR DEVICE AND METHOD OF MANUFACTURING THE SAME

CROSS-REFERENCE TO RELATED APPLICATIONS

This application claims priority from a Japanese patent application serial No. 2008-200544 filed on Aug. 4, 2008, the entire content of which is incorporated herein by reference.

BACKGROUND OF THE INVENTION

1. Field of the Invention

The present invention relates to a nitride-based semiconductor device having a substrate formed of a ZnO single crystal and a nitride-based semiconductor layer formed and grown on the substrate, and a manufacturing method of the same.

2. Description of the Related Art

Conventionally, a semiconductor light emitting device using InGaN is known as a semiconductor light emitting device emitting blue light (a wavelength of not longer than 480 nm) (refer to Patent Reference 1).

In the semiconductor light emitting device using InGaN, an In content increases to reduce a band gap of an active layer for emitting green light. However, when the In content increases, a phase separation tends to occur, thereby making it difficult to obtain the active layer having a uniform In content and decreasing light emitting efficiency. In addition, when a piezoelectric field occurs due to a crystal structure, a probability of radiative recombination decreases, thereby further decreasing the light emitting efficiency. Furthermore, a large amount of threading dislocations occur due to a large lattice constant mismatch relative to the substrate, thereby decreasing the light emitting efficiency and reliability.

To this end, there has been proposed a substrate lattice-matching to the active layer of the nitride-based semiconductor such as InGaN and the like, or a cladding layer having a lattice constant similar to that of the InGaN active layer. The substrate is preferably formed of a ZnO single crystal.

However, when the InGaN layer is directly grown on the substrate formed of the ZnO single crystal, the substrate reacts with the InGaN layer at an interface thereof, thereby making it difficult to obtain a steep interface and a good quality crystal. More specifically, Ga diffuses into the substrate so that it is difficult to obtain the steep interface; and a reaction layer ($Ga_2ZnO_4$) is formed at the interface between the substrate and the InGaN layer, thereby making it difficult to obtain the InGaN layer with good crystal quality. When the InGaN layer is grown at a low temperature, it is possible to suppress the diffusion of Ga and the formation of the reaction layer ($Ga_2ZnO_4$). However, crystal defects tend to be generated during the low temperature growth, thereby decreasing crystallinity of the InGaN layer (refer to Non-patent Reference 1).

Another technology has been known in which, after amorphous $Al_2O_3$ is deposited on a substrate at a low temperature (100° C.) with an atomic layer deposition (ALD) method, amorphous $Al_2O_3$ is crystallized through a high temperature thermal treatment (1,100° C., 20 to 40 minutes), and then an InGaN layer is grown on the crystallized $Al_2O_3$ layer with a MOCVD method (refer to Non-patent reference 2).

[Patent Reference 1]

Japanese Patent Publication No. 06-061527

[Non-patent Reference 1]

MRS Internet Journal vol. 1, Article 16, 1996

[Non-patent Reference 2]

MRS Symp. Proc. Vol. 1035, L 11-23, 2007 Fall Meeting Nov. 26-30

In the conventional technology disclosed in Non-patent Reference 2, the $Al_2O_3$ layer formed on the substrate has a large thickness of 20 to 50 nm. Therefore, it is difficult to transmit a wurtzite type crystal structure and a lattice constant of the ZnO single crystal substrate to the InGaN layer at an upper portion, thereby making it difficult to obtain the InGaN layer with good crystal quality. Furthermore, in the Non-patent Reference 2, the reaction layer ($Al_2ZnO_4$) is formed at the interface between the substrate and the InGaN layer, thereby causing the InGaN layer with insufficient crystal quality.

SUMMARY OF THE INVENTION

It is an object of the present invention to at least partially solve the problems in the conventional technology.

According to an aspect of the present invention, a nitride-based semiconductor device comprises a substrate formed of a zinc oxide (ZnO) single crystal; an active layer formed of gallium indium nitride ($In_xGa_{1-x}N$, $0<x<1$); and an interfacial reaction suppressing layer formed between an oxide layer including the substrate and a nitride layer including the active layer for suppressing an interfacial reaction between the oxide layer and the nitride layer.

According to another aspect of the present invention, a method of manufacturing a nitride-based semiconductor device includes a step of growing an interfacial reaction suppressing layer on a substrate formed of a zinc oxide (ZnO) single crystal for suppressing an interfacial reaction between an oxide layer including the substrate and a nitride layer to be formed on the oxide layer; and a step of growing an active layer formed of gallium indium nitride ($In_xGa_{1-x}N$, $0<x<1$) on the interfacial reaction suppressing layer.

The above and other objects features, advantages and technical and industrial significance of this invention will be better understood by reading the following detailed description of presently preferred embodiments of the invention, when in connection with the accompanying drawings.

DETAILED DESCRIPTION OF THE PREFERRED EMBODIMENTS

Figure 1:
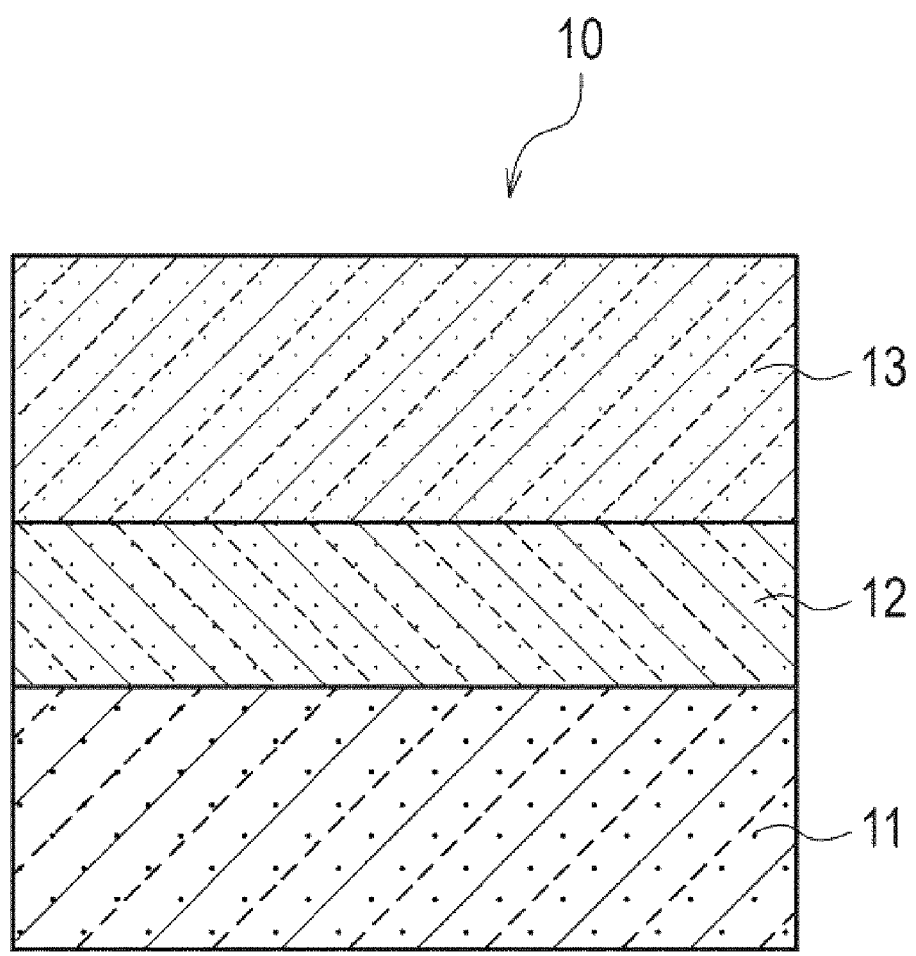
FIG. 1 is a cross sectional view schematically showing a nitride-based semiconductor device according to a first embodiment of the present invention.

Preferred embodiments of the present invention will be described in detail below, with reference to the drawings. In the description of each embodiment, similar elements are designated with the same reference numerals and duplicate explanation thereof is omitted.

(First Embodiment)

FIG. 1 is a cross sectional view schematically showing a nitride-based semiconductor device according to a first embodiment of the present invention.

The nitride-based semiconductor device 10 has a substrate 11 formed of a ZnO single crystal (hereinafter referred to as a ZnO single crystal substrate), an InGaN semiconductor layer 13, and an interfacial reaction suppressing layer 12 for suppressing an interfacial reaction between an oxide layer including the substrate 11 and a nitride layer including the InGaN semiconductor layer 13.

The interfacial reaction suppressing layer 12 is formed between the ZnO single crystal substrate 11, which is an oxide, and the InGaN semiconductor layer 13, which is a nitride.

The InGaN semiconductor layer 13, serving as an active layer, is formed of gallium indium nitride ($In_xGa_{1-x}N$, where $0<x<1$).

A Miller index of a principal plane of the substrate 11 is one of (1_100) (m-plane), (11_20) (a-plane), (0001) (c-plane), (11_22) (r-plane), and (10_1_1), or equivalents thereof.

Further, a principal plane of the ZnO single crystal substrate 11 may be a c-plane (0001) of an oxygen polar (O-polar) plane.

The interfacial reaction suppressing layer 12 is uniformly formed over a plane of the ZnO single crystal substrate 11.

The interfacial reaction suppressing layer 12 is formed of an oxide with excellent high temperature heat resistance or a nitride with excellent high temperature heat resistance, or a lamination of such oxide and nitride. For example, the interfacial reaction suppressing layer 12 may be formed of an oxide or a nitride of one of aluminum, boron, beryllium, and silicon.

The interfacial reaction suppressing layer 12 may be formed of a lamination of an oxide of one of aluminum, boron, beryllium, and silicon and a nitride of any one of aluminum, boron, beryllium, and silicon. The interfacial reaction suppressing layer 12 with the lamination form is formed such that the oxide of one of aluminum, boron, beryllium, and silicon is in contact with the ZnO single crystal substrate 11, which is an oxide, and the nitride of one of aluminum, boron, beryllium, and silicon is in contact with the InGaN semiconductor layer 13, which is a nitride.

Further, the interfacial reaction suppressing layer 12 may be formed of an oxide of gallium or indium. Further, the interfacial reaction suppressing layer 12 may be formed of a lamination of an oxide of gallium or indium and a nitride of gallium or indium. The interfacial reaction suppressing layer 12 with the lamination form is formed such that the oxide of gallium or indium is in contact with the ZnO single crystal substrate 11 and the nitride of gallium or indium is in contact with the InGaN semiconductor layer 13.

A thickness of the interfacial reaction suppressing layer 12 is not less than one molecular layer (ML) and not greater than a critical thickness relative to the ZnO single crystal substrate 11.

The molecular layer represents a unit layer of a minimum thickness including pairs of, for example, a group III atom and a group V atom or pairs of a group III atom and a group VI atom arranged two-dimensionally, and is synonymous with 'monolayer (ML)'. When the interfacial reaction suppressing layer 12 is formed of an aluminum oxide, one monolayer (ML) corresponds to about 0.25 nm.

Further, the critical thickness represents a maximum thickness until which the interfacial reaction suppressing layer 12 grown on the ZnO single crystal substrate 11 is free from cracks, or a maximum thickness until which a lattice constant of the ZnO single crystal substrate 11 can be maintained A thickness of the interfacial reaction suppressing layer 12 is preferably not less than one monolayer (ML) and not greater than 20 nm. When the thickness is less than one monolayer (ML), the interfacial reaction suppressing layer 12 is not excellent in heat resistance. On the other hand, when the thickness is greater than 20 nm, the lattice constant of the ZnO single crystal substrate 11 is not transmitted to the upper layer. A thickness of the interfacial reaction suppressing layer 12 is preferably not less than one monolayer (ML) and not greater than 5 nm.

Further, the interfacial reaction suppressing layer 12 may be formed of a superlattice layer of an oxide or a nitride, having a thickness of not less than one monolayer (ML) and not greater than a critical thickness relative to the ZnO single crystal substrate 11. For example, the interfacial reaction suppressing layer 12 may be formed of a superlattice layer of GaN and InN, each having a thickness of not less than one monolayer (ML) and not greater than a critical thickness relative to the ZnO single crystal substrate 11.

Preferably, a threading dislocation density in the InGaN semiconductor layer 13 is at similar level to that in the ZnO single crystal substrate 11 ($10^5$ $cm^{-2}$ or less).

A manufacturing method of the nitride-based semiconductor device 10 shown in FIG. 1 includes following steps.

(Step 1) A step of growing on a substrate 11 formed of ZnO single crystal an interfacial reaction suppressing layer 12 for suppressing an interfacial reaction between an oxide layer including the substrate 11 and a nitride layer to be formed on the oxide layer.

(Step 2) A step of growing the nitride layer including a semiconductor layer 13 formed of gallium indium nitride [$In_xGa_{1-x}N$ ($0<x\leq1$)] on the interfacial reaction suppressing layer.

It is preferable that the interfacial reaction suppressing layer 12 and the nitride layer including the InGaN semiconductor layer 13 are formed in a multi-chamber process without being exposed to air.

When moving the sample after forming the interfacial reaction suppressing layer 12, the sample is moved in a vacuum or in an inert gas sealed environment.

The interfacial reaction suppressing layer 12 and the InGaN semiconductor layer 13 are deposited by ALD (Atomic Layer Deposition) method, PLD (Pulsed Laser Deposition) method, sputtering method, MBE (Molecular Beam Epitaxy) method, or MOCVD (Metal Organic Chemical Vapor Deposition) method.

According to the first embodiment as configured above, the following effects are obtained.

The interfacial reaction suppressing layer 12, for suppressing interfacial reaction between the oxide layer including the ZnO single crystal substrate 11 and the nitride layer 13 including the InGaN semiconductor layer 13, is provided between the oxide layer and the nitride layer. Therefore, the interfacial reaction between the substrate 11 and the InGaN semiconductor layer 13 is restrained so that formation of a reaction layer ($Ga_2ZnO_4$) is restrained.

Because the interfacial reaction between the ZnO single crystal substrate 11 and the InGaN semiconductor layer 13 is restrained, it becomes possible to grow and thermally treat the InGaN layer 13 at a high temperature. Accordingly, a crystal quality of the InGaN layer 13 can be improved.

Because the interfacial reaction suppressing layer 12 is thin, i.e., the thickness being not less than one monolayer (ML) and not greater than a critical thickness on the ZnO single crystal substrate 11, the wurtzite type crystal structure and the lattice constant of the ZnO single crystal substrate 11 can be transmitted to upper layers.

By implementing smoothing process, i.e., chemical mechanical polishing and thermal treatment, for the surface of the ZnO single crystal substrate 11, an O-polar c-plane substrate with superior smoothness can be obtained. Because the interfacial reaction suppressing layer 12 is grown on such Oxygen-polar (O-polar) c-plane (0001) of the ZnO single crystal substrate 11, a steep nitride/oxide interface can be obtained between the ZnO single crystal substrate 11 and the InGaN semiconductor layer 13, whereby a crystal quality of the InGaN semiconductor layer 13 is further improved.

Because the interfacial reaction suppressing layer 12 is formed uniformly over a surface of the ZnO single crystal substrate 11, it becomes possible to grow the InGaN semiconductor layer 13 at a high temperature, whereby crystal defects such as threading dislocations and the like are not formed. Therefore, the InGaN semiconductor layer 13 is substantially free from crystal defects which would be present if it were grown at a low temperature. A crystal quality of the InGaN semiconductor layer 13 is also improved.

(Second Embodiment)

Figure 2:
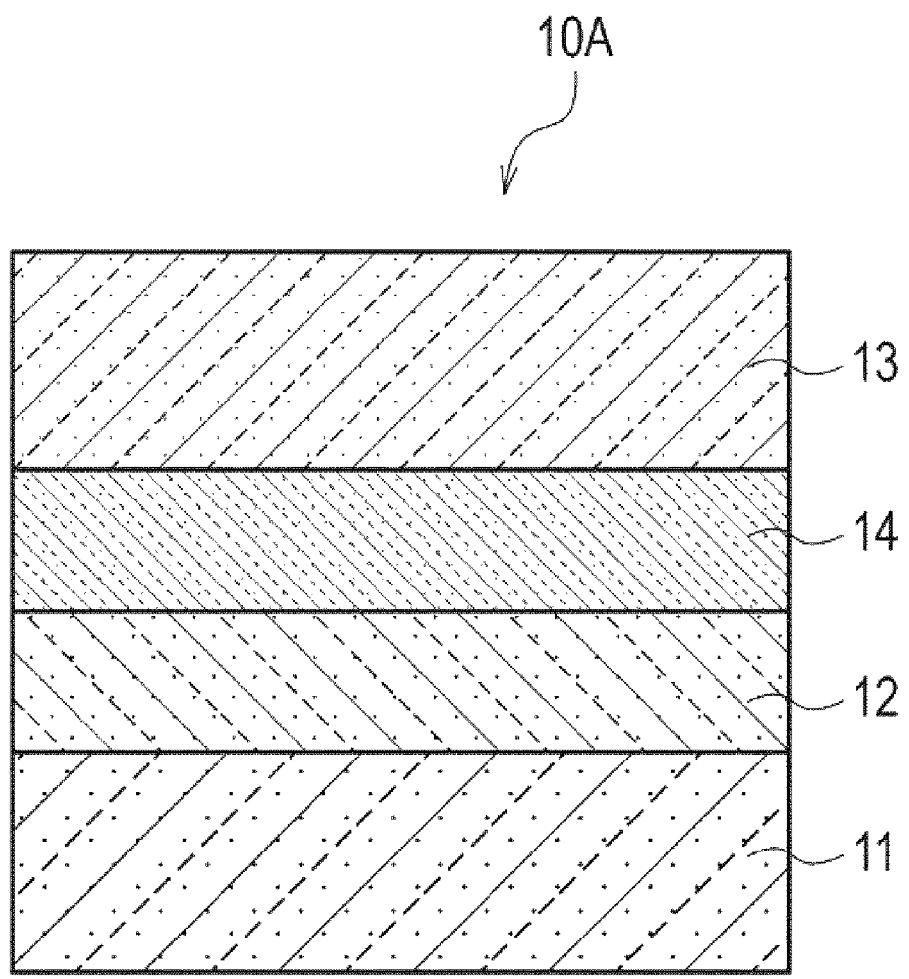
FIG. 2 is a cross sectional view schematically showing a nitride-based semiconductor device according to a second embodiment of the present invention.

FIG. 2 is a cross sectional view schematically showing a nitride-based semiconductor device according to a second embodiment of the present invention.

The feature of the nitride-based semiconductor device 10A according to the second embodiment is found in that, in addition to the nitride-based semiconductor device 10 according to the first embodiment, a pseudomorphic layer 14 which lattice-matches to the substrate 11 is formed between the ZnO single crystal substrate 11 and the InGaN semiconductor layer 13, more specifically, between the interfacial reaction suppressing layer 12 and the InGaN semiconductor layer 13. The pseudomorphic layer 14 is formed of a nitride of gallium or indium.

According to the second embodiment as configured above, the following effect is obtained in addition to that of the first embodiment.

Because the pseudomorphic layer 14 formed of a nitride of gallium or indium is provided between the ZnO single crystal substrate 11 and the InGaN semiconductor layer 13, a steep nitride/oxide interface can be obtained between the ZnO single crystal substrate 11 and the InGaN semiconductor layer 13, whereby a crystal quality of the InGaN layer 13 is improved further.

(Third Embodiment)

Figure 3:
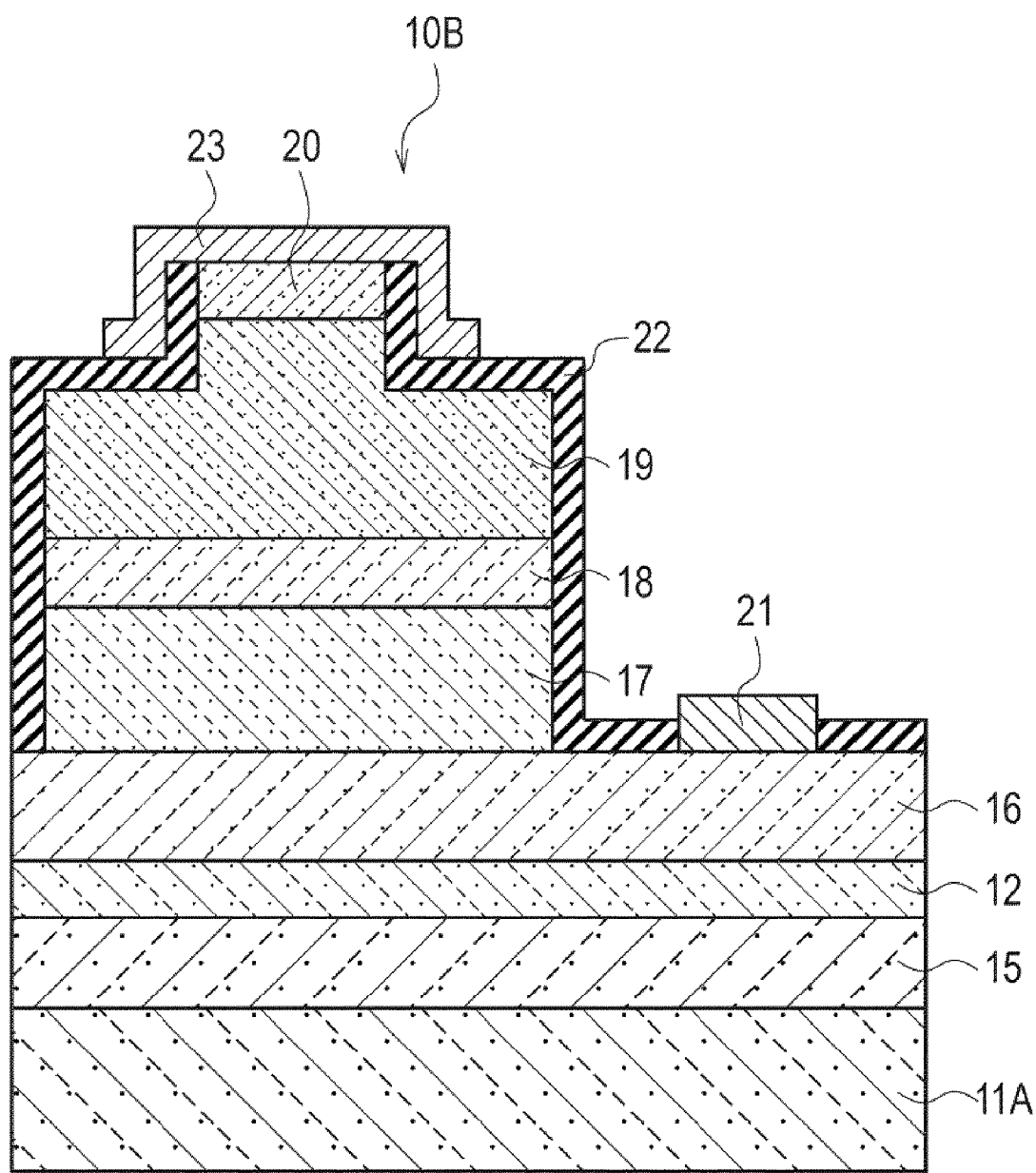
FIG. 3 is a cross sectional view schematically showing a semiconductor laser diode according to a third embodiment of the present invention.

FIG. 3 is a cross sectional view schematically showing a nitride-based semiconductor laser device according to a third embodiment of the present invention.

The nitride-based semiconductor device is configured as a semiconductor laser diode (or a semiconductor light emitting device).

The semiconductor laser diode 10B shown in FIG. 3 includes a ZnO single crystal substrate 11A, and a buffer layer 15 formed of ZnO, an interfacial reaction suppressing layer 12, a lower contact layer 16, a lower cladding layer 17, an InGaN active layer 18, an upper cladding layer 19 and an upper contact layer which are formed in this order on the ZnO single crystal substrate 11A.

The semiconductor laser diode 10B further includes a lower electrode layer 21 formed on the lower contact layer 16, a passivation layer 22, and an upper electrode layer 23 formed on the upper contact layer 20.

In the semiconductor laser device 10B, conductivity types of the lower contact layer 16 and the lower cladding layer 17 are n-types, while conductivity types of the upper cladding layer 19 and the upper contact layer 20 are p-types.

The ZnO buffer layer 15 is provided in order to obtain a smoother surface than the ZnO single crystal substrate 11A and to improve a crystal quality of ZnO.

In the semiconductor laser diode 10B, an epitaxial wafer for use in a semiconductor laser diode to be formed on the ZnO single crystal substrate 11A and which emits light in a long wavelength visible range, such as green light and the like, is constituted by the ZnO buffer layer 15, the interfacial reaction suppressing layer 12, the lower contact layer 16, the lower cladding layer 17, the InGaN active layer 18, the upper cladding layer 19 and the upper contact layer 20. Further, in the present embodiment, the epitaxial wafer is formed on an O-polar c-plane, whose Miller index is (0001), of the ZnO single crystal substrate 11A.

The lower contact layer 16 is provided to obtain ohmic contact with a lower electrode layer 21, which is formed in an exposed portion of the lower contact layer 16. The lower contact layer 16 is formed of a nitride, more specifically an aluminum gallium indium nitride ($Al_{1-p-q}Ga_pIn_qN$, where $0 \leq p \leq 1$, $0 \leq q \leq 1$, $p+q \leq 1$). For example, the lower contact layer 16 is formed of indium gallium nitride (InGaN), aluminum gallium indium nitride (AlInGaN), gallium nitride (GaN), and the like. In the present embodiment, the lower contact layer 16 is doped with silicon (Si) to have n-type conductivity.

The lower cladding layer 17 is a cladding layer of lattice-matching system having a lattice constant which is equal to or smaller than that of the InGaN active layer 18. The lower cladding layer 17 has a refractive index which is smaller than that of the InGaN layer 18 acting as a core, and serves to stably confine light within the active layer 18. The lower cladding layer 17 is formed of a nitride, more specifically aluminum gallium indium nitride ($Al_{1-p-q}Ga_pIn_qN$, where $0 \leq p \leq 1$, $0 \leq q \leq 1$, $p+q \leq 1$). For example, the lower cladding layer 17 is formed of a nitride such as gallium indium nitride (InGaN), aluminum indium nitride (AlInN), aluminum gallium indium nitride (AlInGaN), gallium nitride (GaN), and the like. Note that the lower cladding layer 17 is not limited to one which lattice-matches to the InGaN layer 18, but may be a layer which lattice-matches to at least one of the InGaN layer 18 and the buffer layer 15 or the ZnO single crystal substrate 11A. In the present embodiment, the lower cladding layer 17 is doped with silicon (Si) to have n-type conductivity.

The InGaN active layer 18 is formed by growing a gallium indium nitride ($In_xGa_{1-x}N$, where $0<x<1$) crystal (a InGaN layer) on the lower cladding layer 17. An In content in the InGaN active layer 18 is selected such that emission wavelength is not smaller than 480 nm. More specifically, the InGaN active layer 18 is formed of an InGaN layer having an In content which causes light emission in green color wavelength range, i.e., an In content of not less than 20%. In the present embodiment, the In content in the InGaN active layer 18 is selected to about 30%.

The upper cladding layer 19 is formed by growing Al(Ga)InN which lattice-matches to at least one of the InGaN active layer 18 and the ZnO single crystal substrate 11A on the InGaN active layer 18. In the present embodiment, the upper cladding layer 19 is doped with magnesium (Mg) to have p-type conductivity.

Finally, the contact layer 20 is formed on the upper cladding layer 19 by supplying nitrogen together with Ga and In source, which cells are set at an optimum temperature, onto the substrate. The contact layer 20 is form to have p-type conductivity by being supplied with magnesium (Mg).

According to the third embodiment as configured above, the following effect is obtained in addition to that of the first embodiment.

A semiconductor laser diode having a high light emitting efficiency and superior reliability can be obtained. Occurrence of a piezoelectric field, a phase separation and threading dislocations in the InGaN active layer (InGaN light emitting layer) can be restrained, and an InGaN light emitting layer of superior crystal quality and high In content can be formed, whereby a semiconductor light emitting device (LED, LD, etc) emitting a light of wavelength longer than that of blue color light (i.e., a wavelength longer than 480 nm) and having an improved light emitting efficiency can be realized.

(Fourth Embodiment)

Figure 4:
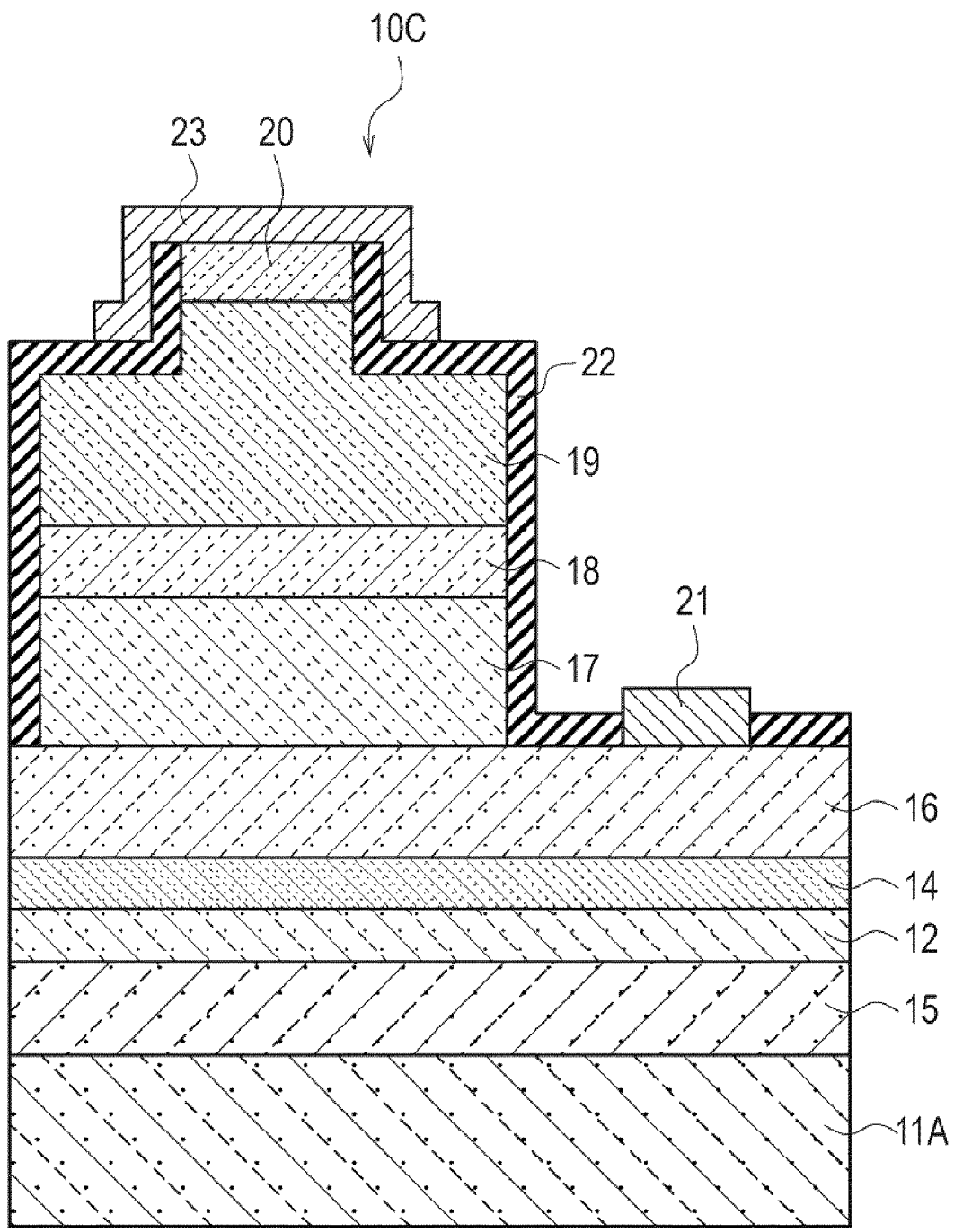
FIG. 4 is a cross sectional view schematically showing a semiconductor laser diode according to a fourth embodiment of the present invention.

FIG. 4 is a cross sectional view schematically showing a nitride-based semiconductor laser device according to a fourth embodiment of the present invention.

In the semiconductor laser diode 10C shown in FIG. 4, a pseudomorphic layer 14 is formed between the interfacial reaction suppressing layer 12 and the lower cladding layer 16 of the semiconductor laser diode 10B shown in FIG. 3. Other configuration of the semiconductor laser diode 10C is similar to that of the semiconductor laser diode 10B shown in FIG. 3.

According to the fourth embodiment as configured above, the following effect is obtained in addition to that of the first embodiment.

Because the pseudomorphic layer 14 formed of a nitride of gallium or indium is provided between the ZnO single crystal substrate 11A and the InGaN semiconductor layer 18, a steep nitride/oxide interface can be obtained between the ZnO single crystal substrate 11A and the InGaN semiconductor layer 18, whereby a crystal quality of the InGaN layer 18 can be improved further.

The above-described embodiments may be modified in the following ways.

In the third and fourth embodiments described above, the present invention may be applied to a semiconductor light emitting device such as a semiconductor laser diode and the like in which optical guide layers are provided between the upper cladding layer and the active layer and between the lower cladding layer and the active layer.

In the third and fourth embodiments described above, the present invention may be applied to a semiconductor light emitting device such as a semiconductor laser diode and the like in which the lower contact layer 16 and the lower cladding layer 17 are formed to have p-type conductivity while the upper cladding layer 19 and the upper contact layer 20 are formed to have n-type conductivity.

In the third and fourth embodiments described above, the present invention may be applied to a vertical type device in which a conductive ZnO substrate is used, the interfacial reaction suppressing layer is made thin and formed to have a conductivity by impurity doping, the ZnO buffer layer is formed to have a conductivity by impurity doping, and an electrode is formed on a back face of the ZnO substrate.

In the third and fourth embodiments described above, the epitaxial wafer for a semiconductor laser diode is formed on an O-polar c-plane whose Miller index is (0001) of the ZnO single crystal substrate 11A. However, the present invention may be applied to a semiconductor light emitting device such as a semiconductor laser diode and the like in which the epitaxial wafer is formed on a Zn-polar c-plane whose Miller index is (0001). In this case, although the smoothness of the substrate is inferior to the case of using O-polar c-plane whose Miller index is (000_1), a smooth surface can be obtained on the Zn-polar c-plane also by subjecting the substrate to an additional chemical mechanical polishing (CMP) after thermal treatment during surface smoothing process. Because of this, the diffusion of Ga from the InGaN active layer 18 into the ZnO single crystal substrate 11A is restrained, making it possible to obtain a steep interface between the ZnO single crystal substrate 11A and the InGaN layer 18 and leading to a further superior crystal quality of the InGaN active layer 18. As a result, a semiconductor light emitting device such as a semiconductor laser diode and the like having a high light emitting efficiency and superior reliability can be obtained.

In each of the embodiments described above, a slightly tilted surface of the ZnO single crystal substrate, whose off-angle is not greater than 1 degree toward m-axis or a-axis, may be used. For example, in the first and second embodiments, the interfacial reaction suppressing layer 12 may be formed on a slightly tilted surface of the ZnO single crystal substrate 11 whose off-angle is not greater than 1 degree toward m-axis or a-axis. Further, in the third and fourth embodiments, the interfacial reaction suppressing layer 12 may be formed on the slightly tilted surface of the ZnO single crystal substrate 11A via the ZnO buffer layer 15.

In the third and fourth embodiments described above, the present invention may be applied also to a semiconductor laser diode without the ZnO buffer layer 15.

In the third and fourth embodiments described above, the present invention may be applied to a semiconductor laser diode in which the InGaN active layer is formed in double hetero-structure or quantum well structure.

In the third and fourth embodiments described above, the present invention may be applied to a semiconductor laser diode having a separate confinement hetero-structure (SCH) in which light confinement layers are provided between the InGaN active layer 18 and the lower cladding layer 17 and between the InGaN active layer 18 and the upper cladding layer 19.

The present invention may be applied to various kinds of electronic devices having the structure of the first embodiment or the second embodiment, such as a field effect transistor (FET), high electron mobility transistor (HEMT) and the like which uses a GaN-based semiconductor.

The nitride-based semiconductor device as explained in the first embodiment and the second embodiment may be applied to hetero-epitaxy technology of dissimilar semiconductors which are reactive at an interface therebetween.

In the second and fourth embodiments, the pseudomorphic layer 14 may be a pseudomorphic layer in which GaN, which is a binary material, is grown on an early stage of growth on the ZnO single crystal substrate, followed by an InGaN layer, an In content which gradually increases (a composition graded InGaN layer), is grown on the GaN layer. In this configuration, because a binary material of GaN is grown on the early stage of growth of the pseudomorphic layer 14, a steep interface between ZnO and the nitride-based semiconductor (an active layer formed of InGaN) can be obtained.

In the third and fourth embodiments, the explanation was given to semiconductor light emitting devices constituted as semiconductor lasers. However, the present invention may be applied to a light emitting device having a pn junction such as LED and the like.

According to the present invention, an interfacial reaction between the oxide and the nitride can be restrained, whereby formation of a reaction layer ($Ga_2ZnO_4$) at an interface between the ZnO single crystal substrate and the active layer formed of gallium indium nitride can be restrained. Thus, it becomes possible to grow and to thermally treat the upper layers such as the active layer formed of gallium indium nitride and the like at a high temperature, resulting in a nitride-based semiconductor device having an improved crystal quality in the upper layers.

Although the invention has been described with respect to the specific embodiments for complete and clear disclosure, the appended claims are not to be thus limited but are to be construed as embodying all modification and alternative construction that may occur to one skilled in the art that fairly fall within the basic teaching herein set forth.

What is claimed is:

1. A nitride-based semiconductor device, comprising:
a substrate formed of a ZnO single crystal;
an active layer formed of gallium indium nitride ($In_xGa_{1-x}N$, $0<x<1$); and
an interfacial reaction suppressing layer formed between an oxide layer including the substrate and a nitride layer including the active layer for suppressing an interfacial reaction between the oxide layer and the nitride layer,
wherein the interfacial reaction suppressing layer has a thickness of not less than one monolayer (ML) and not greater than a critical thickness relative to the substrate; and
wherein the interfacial reaction suppressing layer is formed of an oxide of gallium or indium, or formed of a lamination of the oxide and a nitride of gallium or indium.

* * * * *